United States Patent
Chang et al.

(10) Patent No.: US 6,635,533 B1
(45) Date of Patent: Oct. 21, 2003

(54) METHOD OF FABRICATING FLASH MEMORY

(75) Inventors: Ko-Hsing Chang, Hsinchu (TW); Cheng-Yuan Hsu, Hsinchu City (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/249,256

(22) Filed: Mar. 27, 2003

(51) Int. Cl.[7] .............................................. H01L 21/336
(52) U.S. Cl. ...................... 438/259; 438/264; 438/266; 438/267
(58) Field of Search .................. 438/257, 258, 438/259, 260, 261, 262, 263, 264, 265, 266, 267, 304, 596; 257/314, 315, 316, 317, 318, 319, 320, 321, 322

(56) References Cited

U.S. PATENT DOCUMENTS 6,329,248 B1 * 12/2001 Yang .......................... 438/267
6,420,234 B1 * 7/2002 Park et al. ................... 438/259

* cited by examiner

*Primary Examiner*—Jack Chen
(74) *Attorney, Agent, or Firm*—Jiang Chyun IP Office

(57) ABSTRACT

A method of fabricating a flash memory is provided. A pad layer and a mask layer are formed over the substrate, and then the mask layer is patterned for forming an opening therein. The pad layer exposed by the opening is removed. After a tunneling dielectric layer is formed on the bottom of the opening, a floating gate is formed on the sidewall of the opening. The top of the floating gate is lower than a surface of the mask layer. A source region is formed in the substrate. Thereafter, an inter-gate dielectric layer is formed in the opening and a control gate is filled in the opening. The mask layer is removed and then a gate dielectric layer is formed on the substrate and a spacer is formed on the sidewall of the floating gate and the control gate. A select gate is formed on the sidewall of the spacer. A drain region is formed in the substrate on one side of the select gate.

17 Claims, 4 Drawing Sheets

METHOD OF FABRICATING FLASH MEMORY

BACKGROUND OF INVENTION

1. Field of the Invention

The present invention relates to a semiconductor process. More particularly, the present invention relates to a method of fabricating flash memory.

2. Background of the Invention

The memory device is a semiconductor device used for storing information or data. When the functions of the microprocessor increase and a large amount of programs and operations are required to be executed by the software, the demand for the memory increases. To satisfy this demand, fabricating high-capacity and inexpensive memory devices has become a driving force challenging high integration technique and process.

Flash memory, which is a non-volatile memory, can perform programming, erasing and reading many times and can retain information even when power is interrupted, so it is widely used in personal computers and electrical apparatus.

In the typical flash memory cell, the floating gate and the control gate are made of doped polysilicon. The floating gate and the control gate are isolated by a dielectric layer, and the floating gate is isolated from the substrate by a tunnel oxide layer. During the writing/erase operation, electrons are injected into/ejected from the floating gate with a voltage is applied to the control gate and the source/drain region. During the reading operation, a working voltage is applied to the control gate. At this time, the charging state on the floating gate causes a conducting status of ON or OFF of the channel under the floating gate. The conducting state of ON/Off corresponds to the data of 0/1.

The data in the above mentioned flash memory is erased by increasing the potential of the substrate, the drain/source, or the control gate, relative to the floating gate. The electrons ejected from the floating gate flow into the substrate or the drain/source via the tunnel oxide layer by tunneling. This mechanism is known as the substrate erase mechanism or the drain/source side erase mechanism. Another mechanism is to eject the electrons in the floating gate to the control gate via the dielectric layer. However, the amount of the electrons ejected from the floating gate is difficult to precisely control during erasing. If too many electrons are ejected from the floating gate, the floating gate has net positive charge. This phenomenon is called "over-erasing". When the over-erasing effect is severe, the channel under the floating gate is switched on even when the working voltage is not applied to the control gate. This may lead to an error in data reading. Therefore, to solve the over-erasing problem, a triple polysilicon gate with high-density design has been adopted in many kinds of flash memory.

As shown in FIG. 1, a flash memory cell is formed on a substrate 100. The flash memory has a tunneling oxide layer 102, a floating gate 104, inter-gate dielectric layer 106, control gate 108 and a capping layer 110, wherein the floating gate 104 is under the control gate 108. After the floating gate 104 and the control gate 108 are formed, an ion implantation process is performed to introduce impurities into the substrate 100 to form a source region 112. A spacer 114 is formed on the sidewalls of the floating gate 104 and the control gate 108. A polysilicon layer (non shown) is formed over the substrate 100, and then the polysilicon layer is etched back to form a select gate 116 on the sidewall of the spacer 114.

In the above-mentioned flash memory fabricating process, the floating gate 104 and the control gate 108 are defined by a lithographic process and an etching process. The steps are complicated and the problem of alignment control is produced. On the other hand, the device size is scaled down according to the design rule to increase the integration of the device. In order to lower the voltage applied to the control gate to improve the performance of the device, the issue of increasing the gate coupling ratio between the floating gate and control gate is very important. The gate coupling ratio can be increased by increasing the capacitance of the inter-gate dielectric layer or decreasing the capacitance of the tunneling oxide layer. The capacitance of the inter-gate dielectric layer is increased by increasing the area between the control gate and the floating gate. However, the area between the control gate and the floating gate can not be increased according to the above mentioned process and also satisfy the demand for increasing the integration of device and increasing the gate coupling ratio.

SUMMARY OF INVENTION

The present invention provides a method of fabricating flash memory, wherein a floating gate and a select gate are formed by a self alignment process to simplify the process, increase the coupling ratio between the floating gate and control gate, and improve the yield and performance of the device.

A method of fabricating a flash memory is provided. A pad layer and a mask layer are formed over the substrate, and then the mask layer is patterned for forming an opening therein. The pad layer exposed by the opening is removed. After a tunneling dielectric layer is formed on the bottom of the opening, a floating gate is formed on the sidewall of the opening. The top of the floating gate is lower than a surface of the mask layer. A source region is formed in the substrate. Thereafter, an inter-gate dielectric layer is formed in the opening and a control gate is filled in the opening. The mask layer is removed and then a gate dielectric layer is formed on the substrate and a spacer is formed on the sidewall of the floating gate and the control gate. A select gate is formed on the sidewall of the spacer. A drain region is formed in the substrate of one side of the select gate.

According to the above-mentioned, the floating gate and the select gate are formed by a self alignment means without using a photolithography process; therefore, the process window is increased and the process cost and process time are lower. Moreover, the control gate is formed by forming a conducting layer filled in the opening and then removing a part of the conducting layer besides the opening with chemical mechanical polishing or etching back until the mask layer is exposed. Since the control gate is formed without a photolithography process, the process window is increased and the process cost and process time are lower.

Moreover, since the profile from the top to one side of the floating gate is an arc, the area between the floating gate and the control gate of this invention is larger than that of the prior art. Therefore, the coupling ratio of the floating gate and the control gate is increased and the operating speed and performance of the device is improved.

In addition, since the floating gate has a sharp corner, a larger electric field is established during an erase operation to inject electrons into the select gate through the sharp corner. Therefore, erasing times are shorter and a voltage applied to the control gate is lower.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates the structure of a split gate flash memory in the prior art in a cross-sectional view.

DETAILED DESCRIPTION

Figure 1:
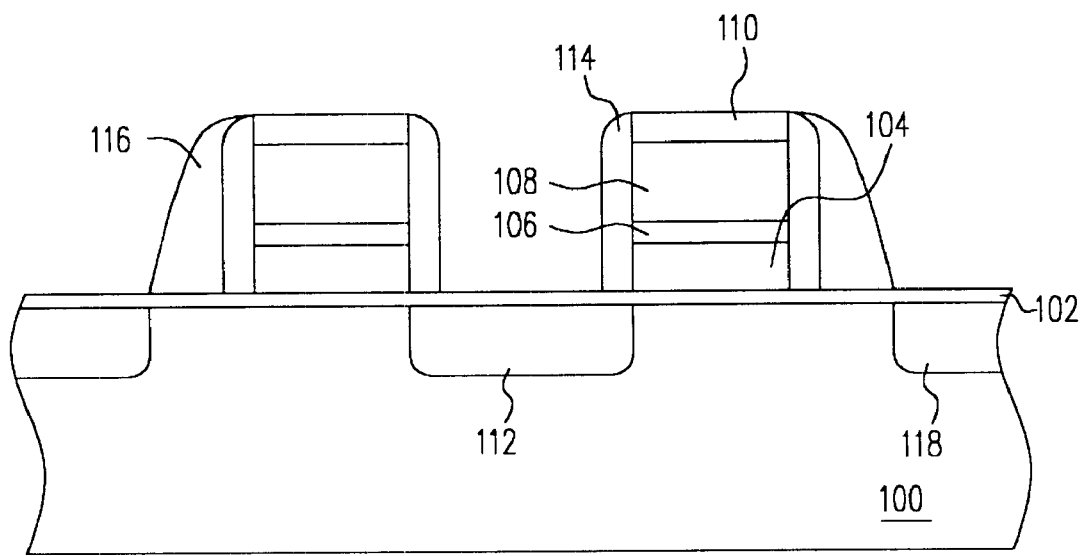
Figure 2A:
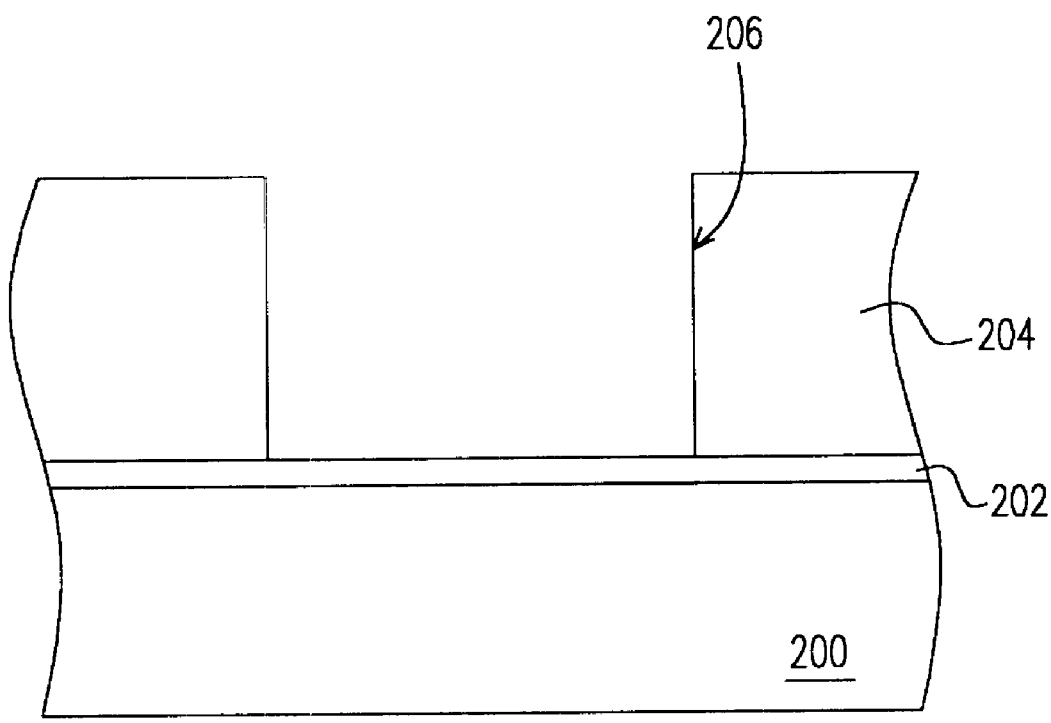
FIGS. 2A to 2E schematically illustrate the process flow of fabricating the split gate flash memory according to the preferred embodiment of the present invention in a cross-sectional view.

FIGS. 2A to 2A schematically illustrate the process flow of fabricating the split gate flash memory according to the preferred embodiment of the present invention in a cross-sectional view.

Referring to FIG. 2A, a substrate 200 is provided. An isolation region (not shown) having a strip layout is formed on the substrate 200 to define an active region. The isolation region is formed by such as a local oxidation (LOCOS) process or a shallow trench isolation (STI) process. A pad layer 202 is formed on the substrate 200. The pad layer 202 is for example, a silicon oxide layer with a thickness of 150 Angstroms formed with a thermal process. Thereafter, a mask layer 204 is formed over the substrate 200. An etching selectivity of the mask layer 204 is different from those of the floating gate, the control gate and the select gate formed in subsequent processes. The mask layer 204 is for example, a silicon nitride layer formed with a chemical vapor deposition process. The mask layer 204 is patterned to form an opening 206, wherein the opening 206 is a trench substantially perpendicular to the isolation region.

Figure 2B:
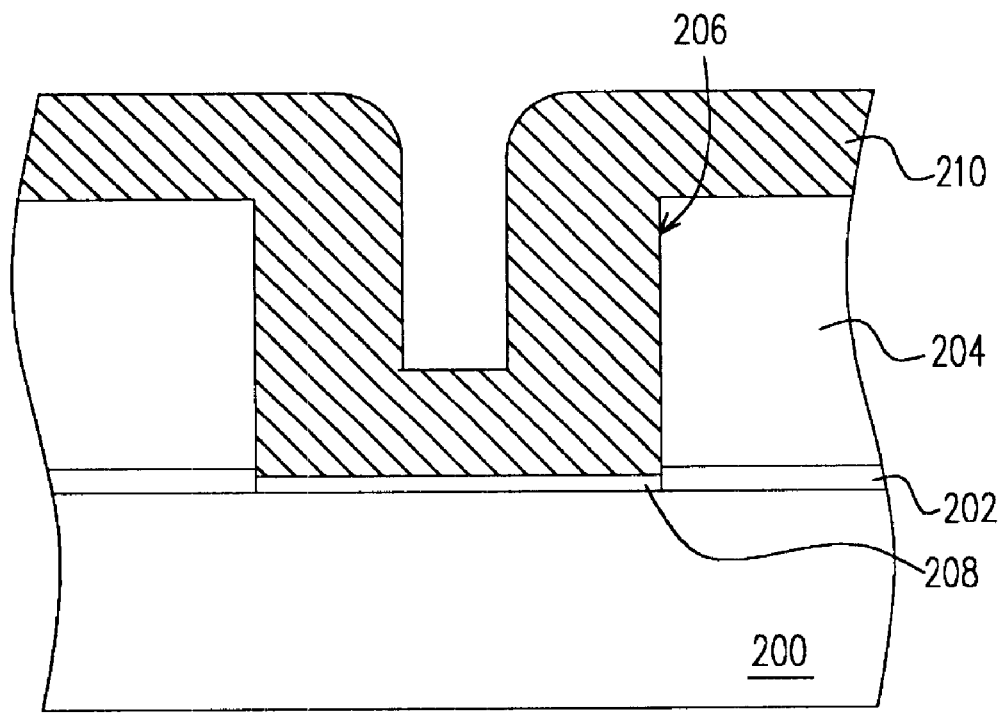

As shown in FIG. 2B, the pad layer 202 exposed by the opening 206 is removed, for example, a wet etching process such as using hydrogen fluoride acid serving as an etchant. A tunneling oxide layer 208 is formed on the substrate 200 exposed by the opening 206. The tunneling oxide layer 208 is, for example, a silicon oxide layer with a thickness of about 90 to 95 Angstroms formed with a thermal process.

A conducting layer 210, for example, a doped polysilicon layer covering the mask layer 204 and the tunneling oxide layer 208, is formed over the substrate 200. In the forming the conducting layer 210 method, for example, a chemical vapor deposition process for forming an undoped polysilicon layer is performed and then an ion implantation process is conducted.

Figure 2C:
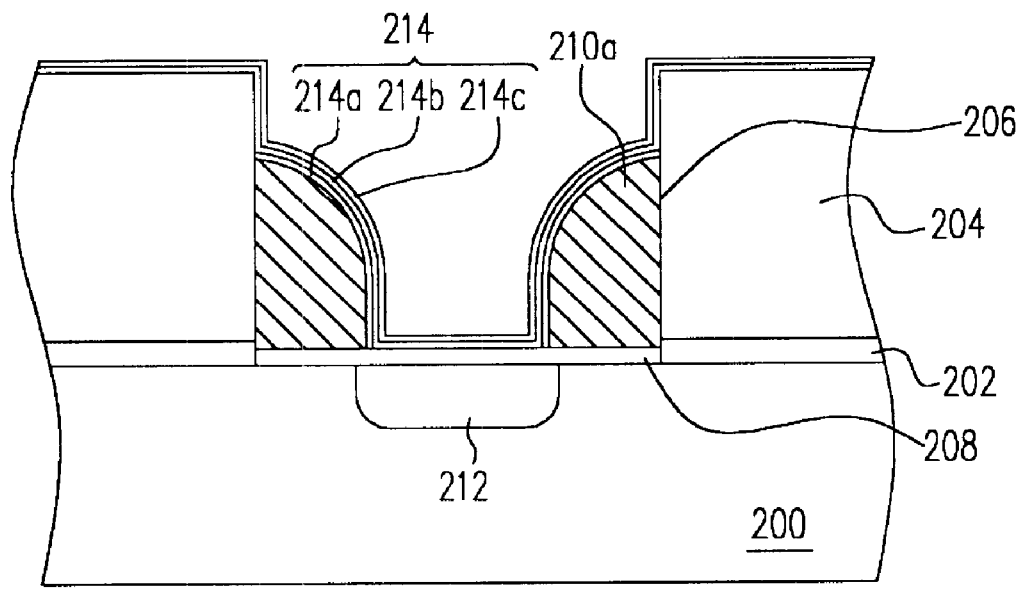

As shown in FIG. 2C, the conducting layer 210 is partially removed, for example, with an anisotropic etching process to form a conducting spacer on the sidewall of the opening 206. The conducting spacer is patterned for removing a part of the conducting spacer on the isolation region to form a floating gate 210a.

An ion implantation process is conducted with the floating gate 210a and mask layer 204 as a mask to form a source region 212 in the substrate 200. An inter-gate dielectric layer 214 covering the mask layer 204, the floating layer 210a and the tunneling layer 208 is formed over the substrate 200. The inter-gate dielectric layer 214 is, for example, a silicon oxide/silicon nitride/silicon oxide stacked layer with the thickness of 60 to 90 Angstroms, 70 to 100 Angstroms and 60 to 100 Angstroms respectively. Also, the inter-gate dielectric layer 214 is, for example, a silicon oxide layer or a silicon oxide/silicon nitride layer. In the method of forming the inter-gate dielectric layer 214, for example, a thermal oxidation is first performed to form a silicon oxide layer 214a. A chemical vapor deposition process is conduced to form a silicon nitride layer 214b on the silicon oxide layer 214a. Thereafter, a wet oxidation with hydrogen and oxygen as reactive gas is performed for oxidizing a part of the silicon nitride layer 214b to form a silicon oxide layer 214c on the silicon nitride layer 214b.

Figure 2D:
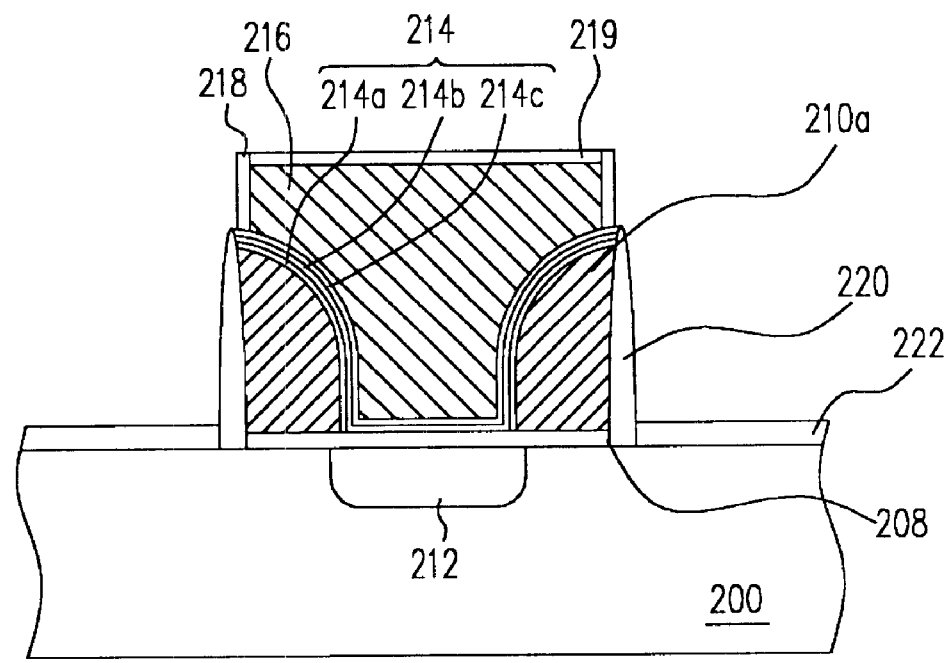

As shown in FIG. 2D, a control gate 216, for example, a doped polysilicon layer is filled in the opening 206. The doped polysilicon layer is formed by, for example, performing a chemical vapor deposition process for forming an undoped polysilicon layer and conducting an ion implantation process for doping the undoped polysilicon layer. In the step of forming the control gate 216, a conducting layer (not shown) is formed covering the substrate 200 and then a part of the conducting layer is removed by, for example, etching back or chemical mechanical polishing until the mask layer 204 is exposed.

Thereafter, the mask layer 204, a part of the inter-gate dielectric layer 214 and pad layer 202 is removed by, for example, wet etching or dry etching to expose the sidewalls of the control gate 216 and the floating gate 210a and a surface of the substrate 200. A capping layer 219, spacer 218, a spacer 220 and a gate dielectric layer 222 formed with such as silicon oxide are respectively formed on the top surface of the control gate 216, the sidewalls of the control gate 216 and the floating gate 210a and the surface of the substrate 200. As the method of forming the capping layer 219, the spacer 218, the spacer 220 and the gate dielectric layer 222, a thermal oxidation process is performed to form a oxide layer, and then a chemical vapor deposition process with tetra ethyl ortho silicate/ozone as reactive gas is conducted to form another oxide layer on the oxide layer. A sharp corner is formed on the top of the floating gate when the spacer 220 is formed on the sidewall of the floating gate 210a. A larger electric field is established during an erase operation because of the sharp corner, therefore, erasing efficiency is increased.

Figure 2E:
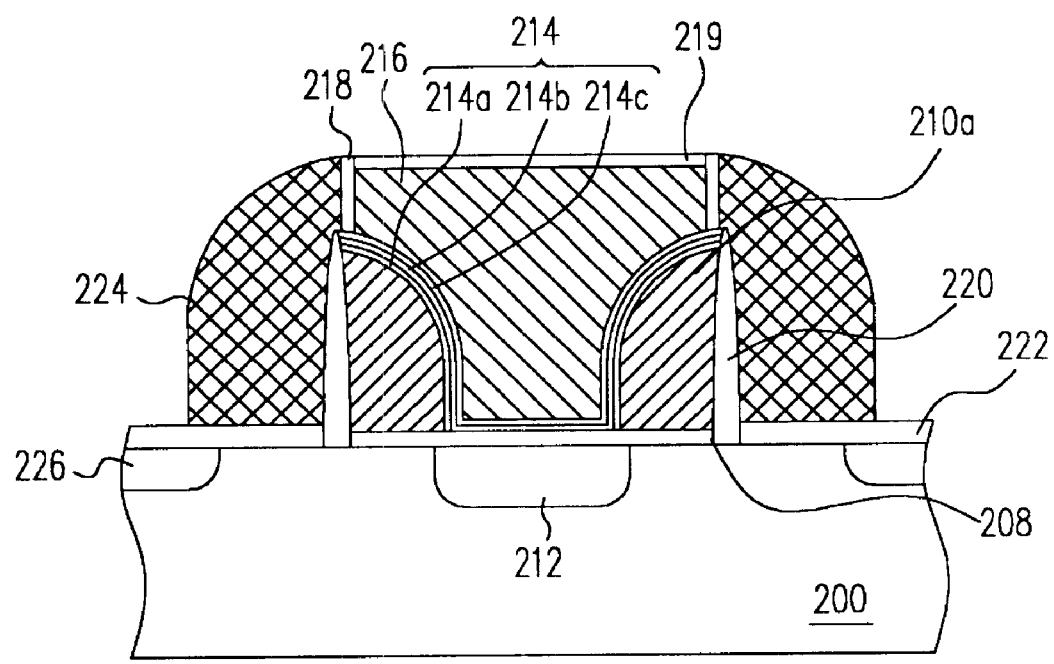

As shown in FIG. 2E, a select gate 224 is formed on the sidewalls of the spacer 218 and 220. As the method of forming the select gate 224, a conducting layer (not shown) is formed and then a part of the conducting layer is removed until the capping layer 219 is exposed to form a conducting spacer on the sidewalls of the spacer 218 and 220, wherein the conducting spacer serves as the select gate 224. A material of the select gate 224 is, for example, doped polysilicon. In forming the conducting layer such as a doped polysilicon layer, a chemical vapor deposition process for forming an undoped polysilicon layer is performed and then an ion implantation process for doping the undoped polysilicon layer is conducted. The part of the conducting layer is removed by, for example, performing an anisotropic etching process. The floating gate 210a, the control gate 216 and select gate 224 form a gate structure of a flash memory. Thereafter, a drain region 226 is formed in the substrate of one side of the select gate by performing an ion implantation process. The subsequent processes are known to those skilled in the art, and therefore, no descriptions are made.

According to the above-mentioned, the floating gate 210a and the select gate 224 are formed by a self alignment method without using a photolithography process, therefore, the process window is increased and the process cost and process time are lower.

The control gate 216 is formed by forming a conducting layer filled in the opening 206 and then removing a part of the conducting layer beside the opening 206 with chemical mechanical polishing or etching back until the mask layer 204 exposed. Since the control gate 216 is formed without a photolithography process, the process window is increased and the process cost and process time are lower.

Since the profile from the top to one side of the floating gate 210a is an arc, the area between the floating gate 210a and the control gate 216 of this invention is larger than that of the prior art. Therefore, the coupling ratio of the floating gate and the control gate is increased and the operating speed and performance of the device is improved.

In addition, since the floating gate 210a has a sharp corner, a larger electric field is established during an erase operation to inject electrons into the select gate 224 through the sharp corner. Therefore, erasing times are shorter and a voltage applied to the control gate is lower.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising:
    providing a substrate and an isolation region formed thereon to define an active region;
    forming a pad layer on the active region of the substrate;
    forming a mask layer over the substrate;
    patterning the mask layer and forming an opening therein;
    removing the pad layer exposed by the opening;
    forming a tunneling dielectric layer on the bottom of the opening;
    forming a floating gate on the sidewall of the opening, wherein the top of the floating gate is lower than a surface of the mask layer;
    forming a source region in the substrate exposed by the opening using the floating gate serving as a mask;
    forming an inter-gate dielectric layer in the opening;
    forming a control gate filled in the opening;
    removing the mask layer;
    forming a gate dielectric layer on the substrate and forming spacers on the side wall of the floating gate and the control gate;
    forming a select gate on the sidewall of the spacers; and
    forming a drain region in the substrate on one side of the select gate.

2. The method of fabricating a flash memory of claim 1, wherein the step of forming the floating gate on the sidewall of the opening comprises:
    forming a first conducting layer over the substrate;
    removing a part of the first conducting layer by an anisotropic etching process to form a first conducting spacer on the sidewall of the opening, wherein the top of the first conducting spacer is lower than the surface of the mask layer; and
    patterning the first conducting spacer to form the floating gate.

3. The method of fabricating a flash memory of claim 1, wherein the step of forming the control gate filled in the opening comprises:
    forming a second conducting layer over the substrate; and
    removing the second conducting layer beside the opening to form the control gate.

4. The method of fabricating a flash memory of claim 3, wherein the second conducting layer besides the opening is removed by etching back.

5. The method of fabricating a flash memory of claim 3, wherein the second conducting layer besides the opening is removed by a chemical mechanical polishing process.

6. The method of fabricating a flash memory of claim 1, wherein the step of forming the select gate on the sidewall of the spacers comprises:
    forming a third conducting layer over the substrate; and
    removing the third conducting layer by an anisotropic etching process to form the select gate on the sidewall of the spacers.

7. The method of fabricating a flash memory of claim 6, wherein the mask layer comprises a silicon nitride layer.

8. The method of fabricating a flash memory of claim 1, wherein the gate dielectric layer comprises a silicon oxide/silicon nitride/silicon oxide stacked layer.

9. The method of fabricating a flash memory of claim 1, wherein the pad layer comprises a silicon oxide layer.

10. The method of fabricating a flash memory of claim 1, wherein the material of the mask layer has an different etching selectivity with the floating gate, the control gate and the select gate.

11. A method of fabricating a flash memory, comprising:
    providing a substrate and an isolation region formed thereon to define an active region;
    forming a pad layer on the active region of the substrate;
    forming a mask layer over the substrate;
    patterning the mask layer and forming an opening therein;
    removing the pad layer exposed by the opening;
    forming a tunneling dielectric layer on the bottom of the opening;
    forming a first conducting layer over the substrate;
    removing a part of the first conducting layer by an anisotropic etching process to form a first conducting spacer on the sidewall of the opening, wherein the top of the first conducting spacer is lower than the surface of the mask layer;
    patterning the first conducting spacer to form a floating gate;
    forming a source region in the substrate exposed by the opening using the floating gate serving as a mask;
    forming an inter-gate dielectric layer in the opening;
    forming a second conducting layer over the substrate;
    removing the second conducting layer beside the opening to form a control gate;
    removing the mask layer;
    forming a gate dielectric layer on the substrate and forming spacers on the side wall of the floating gate and the control gate;
    forming a third conducting layer over the substrate;
    removing the third conducting layer by an anisotropic etching process to form a select gate on the sidewall of the spacers; and forming a drain region in the substrate on one side of the select gate.

12. The method of fabricating a flash memory of claim 11, wherein the second conducting layer beside the opening is removed by etching back.

13. The method of fabricating a flash memory of claim 11, wherein the second, conducting layer beside the opening is removed by a chemical mechanical polishing process.

14. The method of fabricating a flash memory of claim 11, wherein the gate dielectric layer comprises a silicon oxide/silicon nitride/silicon oxide stacked layer.

15. The method of fabricating a flash memory of claim 11, wherein the pad layer comprises a silicon oxide layer.

16. The method of fabricating a flash memory of claim 11, wherein the material of the mask layer has an different etching selectivity with the floating gate, the control gate and the select gate.

17. The method of fabricating a flash memory of claim 11, wherein the mask layer comprises a silicon nitride layer.

* * * * *